(12) United States Patent
Wang

(10) Patent No.: US 6,573,980 B2
(45) Date of Patent: Jun. 3, 2003

(54) REMOVABLE OPTICAL PELLICLE

(75) Inventor: Ching-Bore Wang, Fremont, CA (US)

(73) Assignee: Micro Lithography, Inc., Sunnyvale, CA (US)

( * ) Notice: Subject to any disclaimer, the term of this patent is extended or adjusted under 35 U.S.C. 154(b) by 0 days.

(21) Appl. No.: 09/916,737

(22) Filed: Jul. 26, 2001

(65) Prior Publication Data

US 2003/0020894 A1 Jan. 30, 2003

(51) Int. Cl.$^7$ ............................... G03B 27/62

(52) U.S. Cl. ................. 355/75; 355/76; 355/30

(58) Field of Search ............... 355/75, 76, 30, 355/53

(56) References Cited

U.S. PATENT DOCUMENTS

| | | | | | |
|---|---|---|---|---|---|
| 4,737,387 A | * | 4/1988 | Yen | .................. | 156/60 |
| 4,833,051 A | * | 5/1989 | Imamura | .................. | 269/21 |
| 5,453,816 A | * | 9/1995 | Wang | .................. | 355/75 |
| 5,822,043 A | * | 10/1998 | Ebinuma | .................. | 355/53 |
| 6,406,573 B1 | * | 6/2002 | Cerio | .................. | 156/152 |

* cited by examiner

Primary Examiner—Russell Adams
Assistant Examiner—D. Ben Esplin
(74) Attorney, Agent, or Firm—Kolisch Hartwell, P.C.

(57) ABSTRACT

Optical pellicles for photomasks are described, where the optical pellicle is configured to be reversibly affixed to the photomask with a non-adhesive mounting member, such as a vacuum system or an electrostatic film. The optical pellicles of the invention are readily removed from the photomask and reattached without the use of adhesives, and are well-suited for use by automated methods.

34 Claims, 3 Drawing Sheets

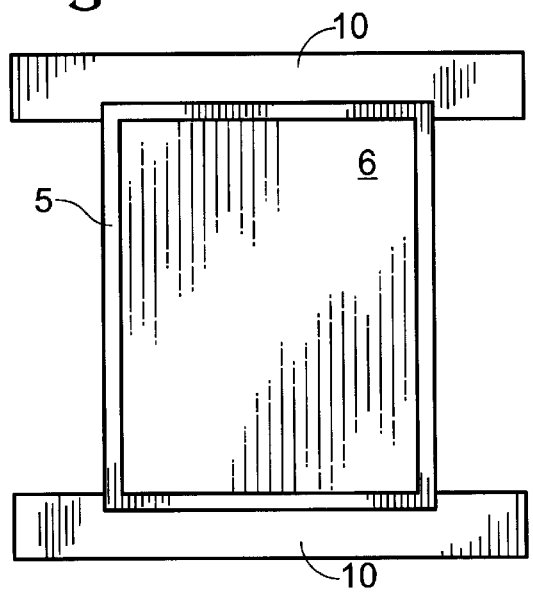
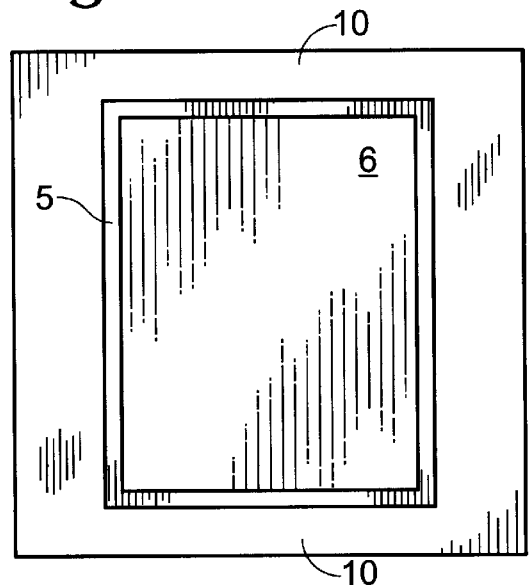
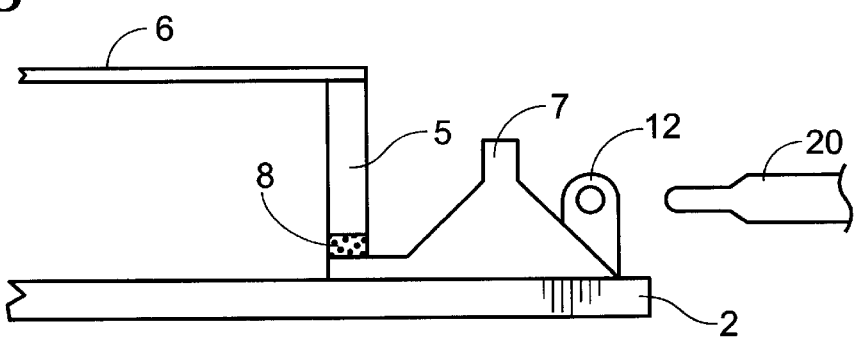
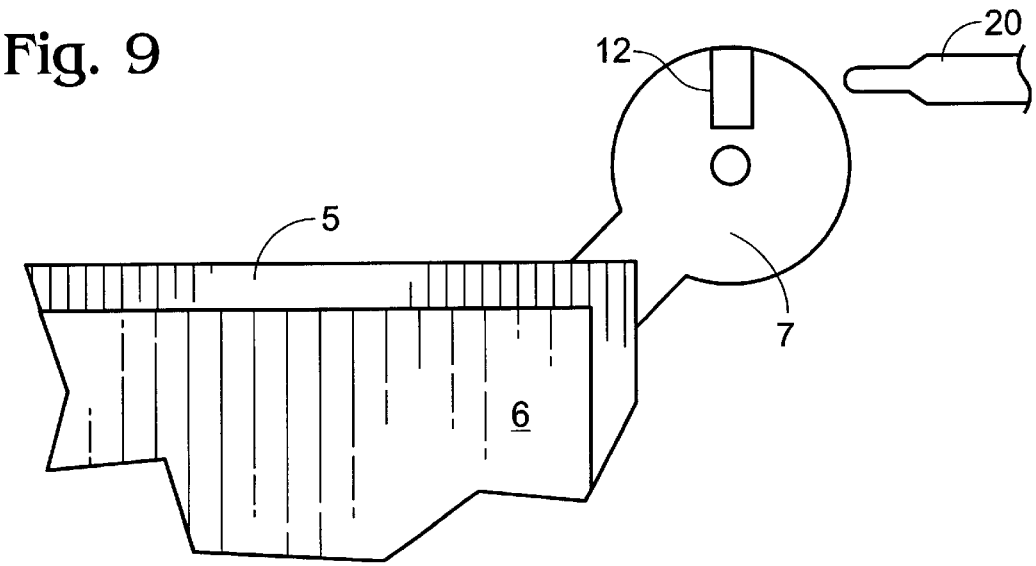

REMOVABLE OPTICAL PELLICLE

FIELD OF THE INVENTION

The invention relates to optical pellicles for photomasks used in photolithographic manufacturing. In particular, the invention relates to optical pellicles that may be attached to a photomask without adhesive, and may be removed and reattached.

BACKGROUND OF THE INVENTION

The manufacture of semiconductor devices typically involves applying a layer of a photosensitive substance (a photoresist) to the surface of a target wafer. The photoresist is exposed to light in a selected pattern using a photomask, and the photoresist is then developed to leave exposed regions of the wafer. Typically, the exposed regions are subsequently etched away or otherwise modified, and the residual photoresist is removed. The pattern of the photomask typically possesses extremely fine details, and the presence of even tiny particles on the surface of the photomask can interfere with the accurate reproduction of the pattern on the target wafer.

To minimize particulate contamination at the mask surface, optical pellicles have been developed that protect the photomask. An optical pellicle is a frame-mounted transparent membrane that is attached to the photomask surface, so that contaminating particles fall onto the pellicle membrane and not the surface of the photomask. The pellicle frame holds the pellicle membrane at a sufficient distance above the mask surface so that any particles that may fall upon the membrane lie outside the focal plane of the illuminating light, and so fail to interfere with the projected mask pattern. The use of optical pellicles in semiconductor manufacture has helped mitigate the effects of contamination by dust and other particulates, and has become widespread in the industry.

However, constant demand for smaller, faster, and more powerful microprocessors has required the semiconductor industry to fabricate ever smaller and faster semiconductor circuits. Manufacturing techniques have advanced to the point that the size of the circuit being produced is effectively limited by the wavelength of light used in the photolithographic process, with shorter wavelength illumination permitting finer details in the resulting circuit structure. Thus, photolithography using 248 nm, 193 nm, and 157 nm (Deep Ultra-Violet, or DUV) illumination has become common, and even the use of 13.5 nm (Extreme Ultra-Violet, or EUV) illumination is known.

However, as the wavelength of the illuminating light decreases, the energy of that light increases. Many airborne organic compounds that were benign at longer wavelengths become photolytically activated when exposed to energetic ultra-violet illumination. For example, light with a wavelength of 248 nm reacts with most halogenated organic compounds, and may interact with some non-halogenated organic compounds. Light having a wavelength of 193 nm reacts readily with a wide range of organic airborne contaminants, and 157 nm light is efficiently absorbed by and generates reactions with even the moisture present in air. The reactive breakdown products of these reactions can interact with the mask pattern itself, resulting in the generation of a variety of defects.

Unfortunately, one source of organic contaminants is the optical pellicles themselves. As shown in FIG. 1, a typical optical pellicle includes a pellicle membrane 6 mounted to a pellicle frame 5. The pellicle frame is typically attached to photomask 2 using adhesive 3. The operational lifetime of the optical pellicle is typically shorter than the operational lifetime of a given photomask, and so the optical pellicle must occasionally be replaced. Unfortunately, removing the optical pellicle often requires a special tool, and may damage the photomask itself. Even more problematic, current methods and adhesives used to adhere optical pellicles to the surfaces of the photomasks serve to generate additional particulate contamination whenever the optical pellicle is removed.

The use of adhesive to mount optical pellicles contributes a source of potential contamination (adhesive residue), and is poorly suited for the rapid removal and replacement required by modern semiconductor manufacturing techniques. What is needed is an optical pellicle that can be readily removed when desired, readily reattached to the photomask, does not leave adhesive residue on the photomask itself, and could be adapted for use by automated methods.

SUMMARY OF THE INVENTION

The invention is an optical pellicle, including a pellicle frame having two sides, a pellicle membrane mounted across the first side of the pellicle frame, and at least one non-adhesive mounting member configured to reversibly affix the second side of the optical pellicle to a photomask. The mounting member is optionally a vacuum mounting member, or an electrostatic mounting member. The optical pellicle of the invention is readily removed from the photomask and reattached, and is well-suited for use by automated methods.

BRIEF DESCRIPTION OF THE DRAWINGS

FIG. 6 is a plan view of an optical pellicle with electrostatic mounting members according to the present invention.

FIG. 7 is a plan view of an alternate embodiment of an optical pellicle with an electrostatic mounting member according to the present invention.

FIG. 8 is a cross-sectional view of a detail of a vacuum mounting member according to the present invention, including a handle and a removal tool.

FIG. 9 is a plan view of the detail of FIG. 8.

DETAILED DESCRIPTION AND BEST MODE OF THE INVENTION

Figure 1:
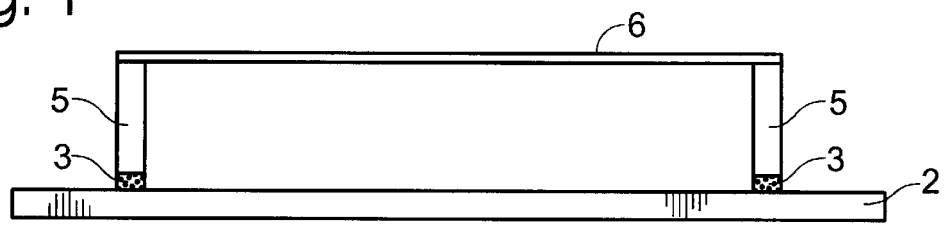
FIG. 1 is a cross-sectional view of an optical pellicle mounted on a photomask using adhesive.

The optical pellicles of the invention comprise a pellicle frame having two sides, a pellicle membrane mounted across the first side of the pellicle frame, and at least one non-adhesive mounting member configured to reversibly affix the second side of the optical pellicle to a photomask.

The pellicle frame is typically shaped from a rigid material, such as aluminum, aluminum alloy, stainless steel, polyethylene resin, or other appropriate metals or polymers. Pellicle frame materials that are light and yet possess high mechanical strength and hardness are preferred. Typically pellicle frames are aluminum or an aluminum alloy that has been anodized to improve the chemical stability of the frame and stained black to minimize the influence of stray light during photolithographic exposure.

The pellicle membrane is generally selected to be transparent to the illumination source used. Although the pellicle membrane may be a pane of glass, or quartz glass, it is typically a polymer such as nitrocellulose, cellulose acetate, modified polyvinyl alcohol, or a fluorocarbon polymer. The pellicle membrane is optionally treated with an anti-reflective coating. The pellicle membrane is mounted on the pellicle frame by adhesive, and the underside of the pellicle membrane, and/or the inside surfaces of the pellicle frame, are optionally coated with an adhesive to minimize the presence of airborne particles beneath the pellicle membrane.

It should be understood that the optical pellicles of the invention may be any shape that facilitates their use in conjunction with a particular photomask. While generally depicted herein as rectangular, the optical pellicle is optionally square, or circular, or any other shape that is well-suited to protect the entire mask pattern of a photomask without obscuring any portion of that mask pattern.

Unlike previous optical pellicles, the optical pellicles of the invention are not affixed to the photomask using adhesive. Rather, the optical pellicles of the invention rely on one or more non-adhesive mounting members for attachment to the photomask. The non-adhesive mounting members of the invention can be rapidly and readily engaged with the photomask surface to affix the optical pellicle securely enough for routine handling, and yet the mounting members can also readily disengaged, leaving no adhesive residue on the surface of the photomask itself. Typically, the optical pellicle of the invention is configured so that when each mounting member of the optical pellicle is fully engaged with the surface of the photomask, the underside of the pellicle frame is substantially flush with the surface of the photomask. In one aspect, when the optical pellicle is affixed to the photomask, the underside of the optical pellicle is essentially in contact with the photomask surface. The point of contact of the optical pellicle is optionally the pellicle frame itself, the mounting member(s) of the optical pellicle, or an additional layer of material on the underside of the pellicle frame that is selected to minimize damage to the photomask surface and also insure a good seal against the photomask surface.

Figure 2:
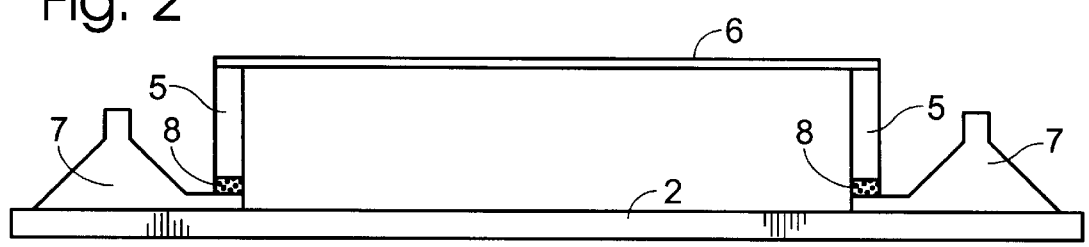
FIG. 2 is a cross-sectional view of an optical pellicle with vacuum mounting members according to the present invention.

As shown in FIG. 2, in one aspect of the invention the mounting member is a vacuum mounting member 7. The vacuum mounting member 7 is attached to pellicle frame 5 using adhesive 8, but there is no adhesive between the mounting member 7 and the photomask 2. Rather, the vacuum mounting member is engaged with the surface of the photomask by a relatively lower air pressure beneath the mounting member than ambient air pressure. In one aspect of the invention, the vacuum mounting member is a flexible and resilient suction cup, that is engaged with the photomask by being pressed securely against the photomask surface, creating a partial vacuum within the mounting member and holding it securely against the photomask. In another aspect of the invention, the vacuum mounting member incorporates an active vacuum system, such as vacuum conduit 23 in FIG. 13. In this embodiment, the vacuum mounting member is engaged with the photomask by placing the mounting member in contact with the surface of the photomask to make an airtight seal, and applying a vacuum via the vacuum conduit.

Figure 4:
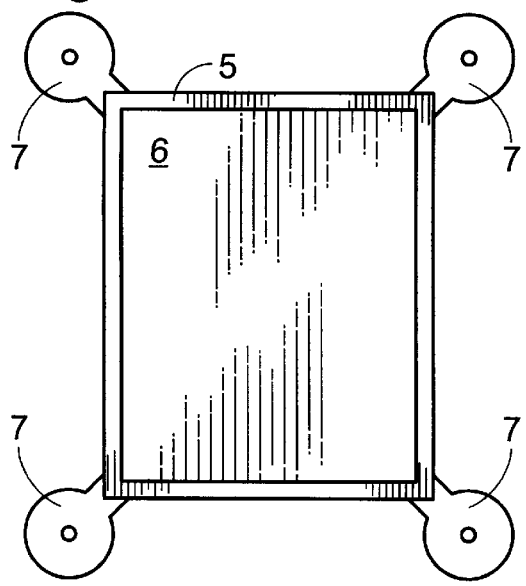
FIG. 4 is a plan view of an optical pellicle with vacuum mounting members according to the present invention.
Figure 5:
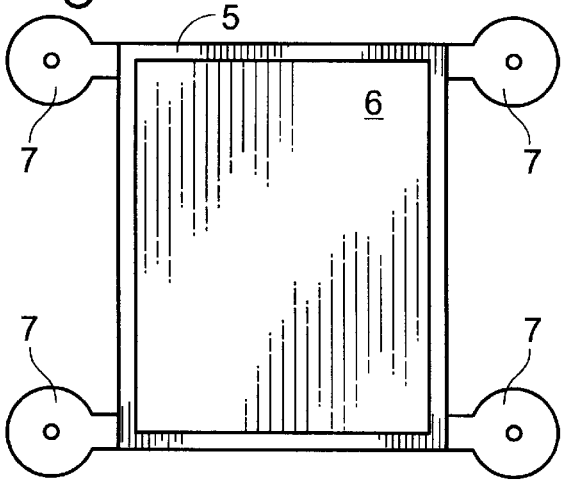
FIG. 5 is a plan view of an alternate embodiment of an optical pellicle with vacuum mounting members according to the present invention.

The optical pellicle may have one or a plurality of vacuum mounting members, that may be arranged around the pellicle frame in any fashion that facilitates secure attachment of the optical pellicle to the photomask surface. The number and orientation of mounting members may in part be influenced by the requirements of the manufacturing equipment used. Two examples of rectangular optical pellicles having four suction mounting members mounted proximal to the pellicle frame corners are shown in plan view in FIGS. 4 and 5.

Alternatively, the non-adhesive mounting member is an electrostatic mounting member. In this aspect of the invention, the optical pellicle is held in place by one or more thin films of electrostatic material, also known as "cling films" that are typically smooth, flexible films that when applied to a glass or other smooth surface adhere instantly, often with substantial holding power. The films are readily removed and can be reapplied. While not wishing to be bound by theory, it is believed that such films adhere to smooth surfaces by virtue of electrostatic attraction, largely due to the presence of a static charge on the thin film. Other intermolecular forces, such as Van der Waal's forces, may also contribute to the adhesion of the electrostatic films.

Figure 3:
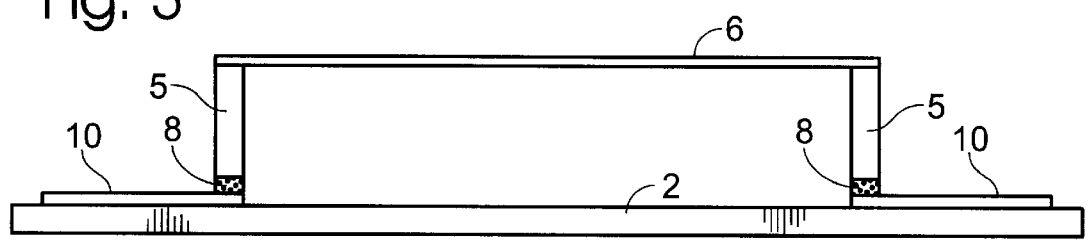
FIG. 3 is a cross-sectional view of an optical pellicle with electrostatic mounting members according to the present invention.

An optical pellicle of the invention that utilizes an electrostatic mounting member is shown in cross-section in FIG. 3, where the mounting member 10 is attached to pellicle frame 5 with adhesive 8, and adheres to photomask 2 by virtue of the attraction between the film and the surface of the photomask.

The optical pellicle of the invention may have one or a plurality of electrostatic mounting members. Typically each electrostatic mounting member is a thin film extending outwardly from the second side of the pellicle frame in the same plane as the second side of the pellicle frame. Where there is more than one electrostatic mounting member, they typically take the form of film tabs or strips, as shown in plan view in FIG. 6, which shows an optical pellicle having two electrostatic film tabs 10 on each side of the pellicle frame 5. Alternatively, the electrostatic mounting member may be an electrostatic film skirt that extends from the entire periphery of the second side of the pellicle frame, as shown by skirt 10 in FIG. 7.

The non-adhesive mounting members of the invention are typically manufactured from materials that are compatible with semiconductor manufacturing processes, and yet confer the desired physical properties on the mounting members such that they are useful for the purposes of engaging the photomask surface. In general, the mounting members must be chemically inert, resilient, and flexible. The mounting member is therefore typically composed of a chemically inert flexible polymer. Examples of suitable polymers include, without limitation, silicone polymers, vinyl polymers, and fluorocarbon polymers. While fluorocarbon polymers exhibit excellent chemical inertness, vinyl polymers possess advantageous properties with respect to electrostatic adhesion. A variety of manufactured articles prepared from poly(fluorocarbons) and their methods of manufacture are described in U.S. Pat. Nos. 4,530,569 to Squire (1985); 4,948,851 to Squire (1990); 4,975,505 to Squire (1990); 4,982,056 to Squire (1991); 5,000,547 to Squire (1991); 4,977,025 to Squire (1990); 4,977,026 to Squire (1990); 4,977,008 to Squire (1990); 4,977,297 to Squire (1990); 4,973,142 to Squire (1990); 4,999,248 to Squire (1991); 4,985,308 to Squire (1991); 5,006,382 to Squire (1991); 5,296,283 to Froggatt (1994); 5,308,685 to Froggatt (1994); 5,076,659 to Bekiarian et al. (1991) and 5,051,114 to Nemser et al. (1991), each of which is hereby incorporated by reference.

The non-adhesive mounting members of the invention optionally incorporate a handle to facilitate the engagement of the mounting member with the surface of the photomask, or to facilitate the detachment of the mounting member from the surface of the photomask. In particular, where the mounting member is a suction cup or an electrostatic film, the use of a handle to lift one edge of the mounting member greatly facilitates detachment of the mounting member from the surface of the photomask. The handle may be adapted to be physically manipulated by an operator, or the handle may incorporate features to make it compatible with tools or manipulators operated by automated machinery.

Figure 10:
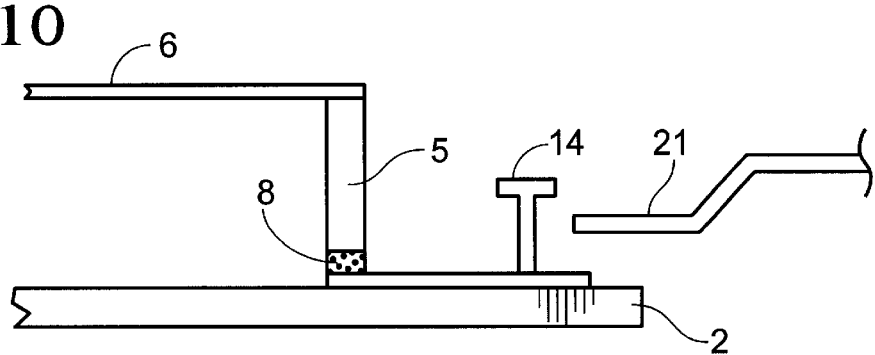
FIG. 10 is a cross-sectional view of a detail of an electrostatic mounting member according to the present invention, including a handle and a removal tool.
Figure 11:
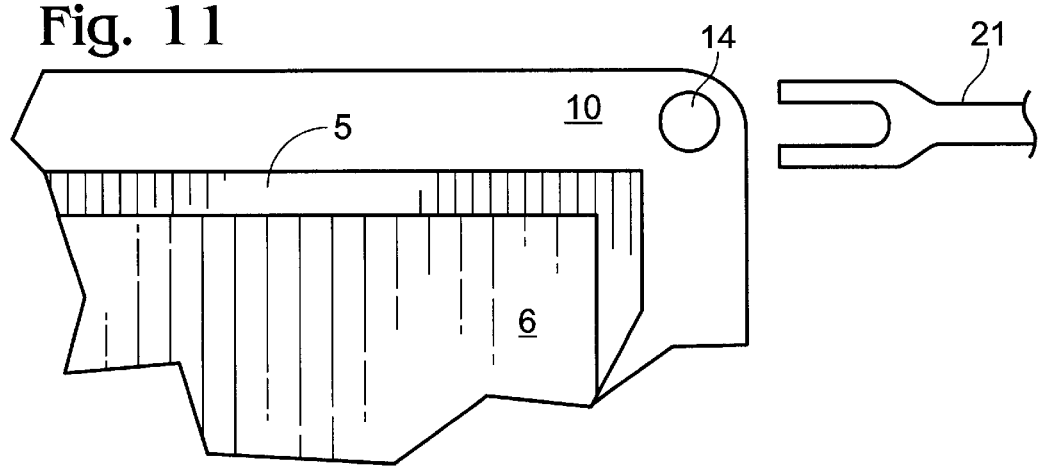
FIG. 11 is a plan view of the detail of FIG. 10.

Appropriate handles include any of a variety of shapes designed to interface with an appropriate tool, including any of a number of depressions, projections, ridges, slots, knobs, or other surface features intended to aid the manipulation of the handle. For example, FIG. 9 shows a handle 12 that incorporates a hole, the handle attached to vacuum mounting member 7. The hole in the handle 12 is intended to mate with a matching probe on a removing tool 20. The relationship between the vacuum mounting member 7, the handle 12 and the tool 20 is also shown in a top view in FIG. 9. In FIG. 10, an alternate handle design incorporating a flange or button is shown attached to an electrostatic mounting member 10 in conjunction with a removal tool 21. As shown from above in FIG. 11, the removal tool 21 incorporates a slot to slide beneath the flange or button on handle 14 to positively engage the handle for removal. Selection of a particular combination of handle design and mounting member design is largely dictated by the requirements of the semiconductor manufacturing process used, and is a matter of routine optimization for a skilled artisan.

Figure 12:
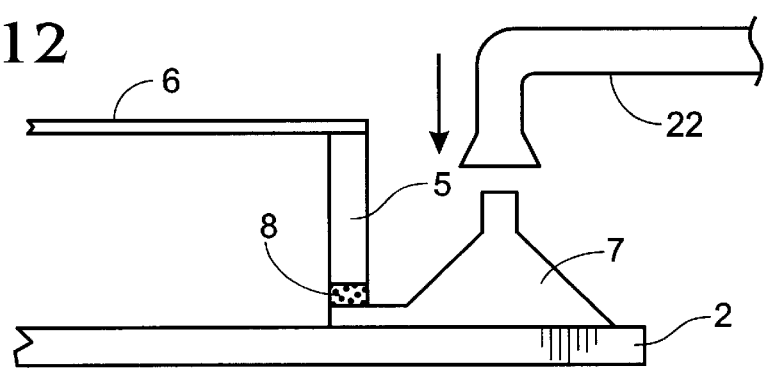
FIG. 12 is a cross-sectional view of a vacuum mounting member according to the present invention, including a tool for engaging the mounting member.
Figure 13:
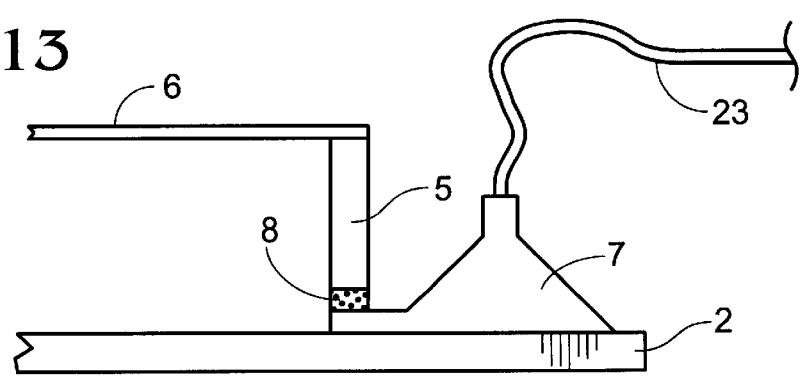
FIG. 13 is a cross-sectional view of a vacuum mounting member according to the present invention, including a vacuum conduit.

Affixing the optical pellicle to the photomask requires precise positioning, so that the mask pattern of the photomask is protected, and yet the optical pellicle does not obscure any portion of the pattern itself. Where the non-adhesive mounting member incorporates an active vacuum system, the optical pellicle generally affixed by placing it on the photomask, and applying a vacuum to the mounting member with vacuum conduit 23 as generally shown in FIG. 13. One advantage of an active vacuum system is during the pellicle removal process, one or more of the suction cups 7 may have their respective vacuums released, thus permitting a gradual removal or peeling of the optical pellicle from the photomask surface. This may be more desirable, in some applications, than a simultaneous removal of all of the suction cups.

Where the non-adhesive mounting member incorporates a passive vacuum system, such as one or more suction cups, each suction cup is physically engaged, typically by applying gentle pressure to the suction cup in a direction perpendicular to the surface of the photomask. An exemplary tool for applying such pressure is shown at 22 in FIG. 12. Application tool 22 may be a separate tool, or it may optionally incorporate additional physical features, such as a slot or probe, that permit its use as a removal tool. An optical pellicle that incorporates a passive vacuum system may also be removed somewhat gradually through stepwise manipulation of the handles on selected mounting members.

Placement of an optical pellicle that incorporates one or more electrostatic mounting members typically requires only precise positioning of the optical pellicle on the surface, as adhesion is typically instantaneous once the optical pellicle is placed on the photomask surface. Removal of the optical pellicle is typically accomplished by peeling the electrostatic film or films from the photomask surface gradually, typically by manipulation of an attached handle.

Although the present invention has been shown and described with reference to the foregoing operational principles and preferred embodiments, it will be apparent to those skilled in the art that various changes in form and detail may be made without departing from the spirit and scope of the invention. The present invention is intended to embrace all such alternatives, modifications and variances which fall within the scope of the appended claims.

What is claimed is:

1. An optical pellicle, comprising:
   a pellicle frame having two sides,
   a pellicle membrane mounted across the first side of said pellicle frame, and
   at least one non-adhesive mounting member configured to reversibly affix the second side of the pellicle frame to a photomask, by contacting the photomask outwardly of the pellicle frame, and such that the at least one non-adhesive mounting member is mounted between the photomask and the pellicle frame.

2. The optical pellicle of claim 1, where the non-adhesive mounting member affixes the optical pellicle to the two-sided photomask, such that the non-adhesive mounting member attaches to only one side of the photomask.

3. The optical pellicle of claim 1, where the non-adhesive mounting member is adhered to the pellicle frame at the second side of the pellicle frame.

4. The optical pellicle of claim 3, where the non-adhesive mounting member extends outwardly from the pellicle frame to contact the photomask.

5. The optical pellicle of claim 4, where the non-adhesive mounting member contacts the photomask along an entire length of the non-adhesive mounting member.

6. The optical pellicle of claim 1, where each mounting member includes a handle.

7. The optical pellicle of claim 1, where the optical pellicle is configured so that when each mounting member is fully engaged with the photomask, the second side of the pellicle frame is essentially flush with the photomask surface.

8. The optical pellicle of claim 1, where each non-adhesive mounting member is a vacuum mounting member.

9. An optical pellicle, comprising:
   a pellicle frame having two sides,
   a pellicle membrane mounted across the first side of said pellicle frame, and
   at least one vacuum mounting member configured to reversibly affix the second side of the optical pellicle to a photomask, where each vacuum mounting member is a suction cup.

10. The optical pellicle of claim 1, where the non-adhesive mounting member is an electrostatic mounting member.

11. The optical pellicle of claim 10, where each electrostatic mounting member is an electrostatic film extending outwardly from the second side of the pellicle frame in the same plane as the second side of the pellicle frame.

12. The optical pellicle of claim 11, where the electrostatic film extends from the entire periphery of the second side of the pellicle frame.

13. An optical pellicle, comprising:
    a pellicle frame having two sides,
    a pellicle membrane mounted across a first side of said pellicle frame, and
    at least one vacuum mounting member configured to reversibly affix the second side of the optical pellicle to a photomask, such that a region of attachment between the at least one vacuum mounting member and the photomask is located a distance away from the pellicle frame.

14. The optical pellicle of claim 13, having a plurality of vacuum mounting members, each vacuum mounting member having a vacuum conduit configured to apply a vacuum beneath the mounting member.

15. The optical pellicle of claim 13, having a plurality of vacuum mounting members that are suction cups, each suction cup including a handle, where the optical pellicle is configured so that when each suction cup engages the photomask, the second side of the pellicle frame is essentially flush with the photomask surface.

16. The optical pellicle of claim 15, where the handles of the suction cups are configured so that the optical pellicle can be affixed or detached by automated methods.

17. The optical pellicle of claim 15, where each suction cup is composed of a chemically inert flexible polymer.

18. The optical pellicle of claim 17, where the chemically inert flexible polymer is a silicone polymer or a fluorocarbon polymer.

19. An optical pellicle, comprising:
    a pellicle frame,
    a pellicle membrane mounted across one side of said pellicle frame, and
    an electrostatic mounting member configured to reversibly affix the optical pellicle to a photomask.

20. The optical pellicle of claim 19, where the electrostatic mounting member is an electrostatic film extending outwardly from periphery of the second side of the pellicle frame in the same plane as the second side of the pellicle frame.

21. The optical pellicle of claim 19, where the optical pellicle is configured so that when the electrostatic mounting member is engaged with the photomask, the second side of the pellicle frame is essentially flush with the photomask surface.

22. The optical pellicle of claim 19, where the electrostatic mounting member includes at least one handle configured so that the optical pellicle can be affixed or detached by automated methods.

23. The optical pellicle of claim 19, where the electrostatic mounting member is composed of a chemically inert flexible polymer.

24. The optical pellicle of claim 23, where the chemically inert flexible polymer is a silicone polymer, a vinyl polymer, or a fluorocarbon polymer.

25. A method of mounting an optical pellicle comprising the steps of:
    providing an optical pellicle, the optical pellicle comprising:
        a pellicle frame having two sides;
        a pellicle membrane mounted across the first side of said pellicle frame; and
        mounting at least one non-adhesive mounting member so that it is attached to the second side of the pellicle frame and extends outwardly from the pellicle frame;
    reversibly affixing the second side of the pellicle frame to the photomask; and
    exposing the layer of photoresist to the illumination source through both the pellicle membrane and the photomask.

26. An optical pellicle, comprising:
    a pellicle frame having two sides,
    a pellicle membrane mounted across the first side of said pellicle frame, and
    at least one non-adhesive mounting member offset from the pellicle frame and reversibly mounting the second side of the pellicle frame to a two-sided photomask.

27. The optical pellicle of claim 26, where the non-adhesive mounting member affixes the optical pellicle to the two-sided photomask, such that the non-adhesive mounting member attaches to only one side of the photomask.

28. The optical pellicle of claim 26, where the non-adhesive mounting member is adhered to the pellicle frame at the second side of the pellicle frame.

29. The optical pellicle of claim 28, where the non-adhesive mounting member extends outwardly from the pellicle frame to contact the photomask.

30. The optical pellicle of claim 29, where the non-adhesive mounting member contacts the photomask along an entire length of the non-adhesive mounting member.

31. The optical pellicle of claim 26, where each mounting member includes a handle.

32. The optical pellicle of claim 26, where the non-adhesive mounting member is mounted between the photomask and the pellicle frame.

33. The optical pellicle of claim 26, where each non-adhesive mounting member is a vacuum mounting member.

34. The optical pellicle of claim 26, where the non-adhesive mounting member is an electrostatic mounting member.

* * * * *